United States Patent
Li

(10) Patent No.: US 12,322,308 B2
(45) Date of Patent: Jun. 3, 2025

(54) GATE DRIVE CIRCUIT AND DISPLAY DEVICE

(71) Applicant: Guangzhou China Star Optoelectronics Semiconductor Display Technology Co., Ltd., Guangdong (CN)

(72) Inventor: Zhihua Li, Guangdong (CN)

(73) Assignee: Guangzhou China Star Optoelectronics Semiconductor Display Technology Co., Ltd., Guangzhou (CN)

( * ) Notice: Subject to any disclaimer, the term of this patent is extended or adjusted under 35 U.S.C. 154(b) by 0 days.

(21) Appl. No.: 18/496,848

(22) Filed: Oct. 28, 2023

(65) Prior Publication Data

US 2024/0221557 A1     Jul. 4, 2024

(30) Foreign Application Priority Data

Dec. 30, 2022   (CN) .......................... 202211736928.7

(51) Int. Cl.
*G09G 3/00*     (2006.01)
*G11C 19/28*    (2006.01)

(52) U.S. Cl.
CPC ........... *G09G 3/006* (2013.01); *G11C 19/287* (2013.01); *G09G 2310/0267* (2013.01); *G09G 2310/0286* (2013.01)

(58) Field of Classification Search
CPC .... G11C 19/28; G11C 19/287; G09G 3/3677; G09G 3/006; G09G 2310/0286; G09G 2310/0267

See application file for complete search history.

(56) References Cited

U.S. PATENT DOCUMENTS

2020/0075113 A1*   3/2020   Yuan ...................... G11C 19/28

* cited by examiner

*Primary Examiner* — Deeprose Subedi
(74) *Attorney, Agent, or Firm* — PV IP PC; Wei Te Chung

(57) ABSTRACT

A gate drive circuit and a display device are provided, wherein the gate drive circuit includes cascaded shift registers. In each shift register, a scan output terminal is electrically connected to a scan signal line, and a pull-down module transmits a voltage of a power node to the scan output terminal when the pull-down module is conducting. In odd-numbered rows, the power node electrically connects a first detection signal line, while in even-numbered rows, the power node electrically connects a second detection signal line. When the gate drive circuit is in a driving state, the first detection signal line and the second detection signal line transmit a first voltage to the scan signal lines when the pull-down modules are conducting.

14 Claims, 2 Drawing Sheets

GATE DRIVE CIRCUIT AND DISPLAY DEVICE

FIELD OF DISCLOSURE

The present application relates to a field of display technology, and more particularly to a gate drive circuit and a display device.

DESCRIPTION OF RELATED ART

In related technologies, a display panel is provided with multiple scan lines used to provide scanning signals. In some display panels using DLS architecture, it is common for adjacent scan lines to experience short circuits, and it is difficult to detect these short circuits.

SUMMARY OF INVENTION

Embodiments of the present application provides a gate drive circuit and a display device to address technical issues of the difficulty in detecting short circuits between adjacent scan lines.

In order to solve the above issues, the present application provides technical solutions as follows.

In a first aspect, the present application provides a gate drive circuit including multiple cascaded shift registers, wherein each of the shift registers includes a scan output terminal and a pull-down module; in each of the shift registers, the scan output terminal is electrically connected to a scan signal line, and the pull-down module is configured to transmit a voltage of a power node to the scan output terminal when the pull-down module is turned on;

wherein in each of the shift registers located in odd-numbered rows, the power node is electrically connected to a first detection signal line, while in each of the shift registers located in even-numbered rows, the power node is electrically connected to a second detection signal line;

when the gate drive circuit is in a driving state, the first detection signal line and the second detection signal line are configured to transmit a first voltage to the corresponding scan signal lines when the respective pull-down modules are turned on; when the gate drive circuit is in a detection state, the pull-down modules are turned on, and the first detection signal line and the second detection signal line transmit a second voltage to the corresponding scan signal lines; the second voltage is greater than the first voltage; and if it is detected that a resistance between the first detection signal line and the second detection signal line is lower than in the driving state, it is determined that a short circuit occurs in the gate drive circuit.

In one embodiment, an output terminal of each of the pull-down modules is electrically connected to the scan output terminal, a control terminal of each of the pull-down modules is electrically connected to the scan output terminal in the next-stage shift register, and an input terminal of each of the pull-down modules is electrically connected to the power node.

In one embodiment, the gate drive circuit includes a first clock signal line and a second clock signal line, wherein each of the shift registers further includes:

a pull-up module, wherein an output terminal of the pull up module is electrically connected to the scan output terminal;

wherein in each of the shift registers located in the odd-numbered rows, an input terminal of the pull-up module is electrically connected to the first clock signal line, while in each of the shift registers located in the even-numbered rows, an input terminal of the pull-up module is electrically connected to the second clock signal line;

wherein when the gate drive circuit is in the detection state, the first clock signal line and the second clock signal line are used to transmit a third voltage to the corresponding scan signal lines when the pull-up modules are turned on; wherein the third voltage is greater than the first voltage.

In one embodiment, each of the shift registers further includes:

a pull-up control module, wherein an output terminal of the pull-up control module is electrically connected to a control terminal of the pull-up module;

wherein an input terminal of the pull-up control module and a control terminal of the pull-up control module in each of the shift registers are electrically connected to a scan output terminal of the previous-stage shift register.

In one embodiment, each of the shift registers further includes:

a pull-down control module, wherein an output terminal of the pull-down control module is electrically connected to the control terminal of the pull-up module, and an input terminal of the pull-down control module is electrically connected to the power node, wherein a control terminal of each of the pull-down control modules is electrically connected to the scan output terminal of the next-stage shift register.

In one embodiment, the pull-down module includes a pull-down transistor, and an output terminal of the pull-down transistor is electrically connected to the scan output terminal; among the shift registers, in each of the shift registers located in the odd-numbered rows, an input terminal of the pull-down transistor is electrically connected to the first detection signal line, while in each of the shift registers located in the even-numbered rows, an input terminal of the pull-down transistor is electrically connected to the second detection signal line;

the pull-up module includes a pull-up transistor, and an output terminal of the pull-up transistor is electrically connected to the scan output terminal; among the shift registers, in each of the shift registers located in the odd-numbered rows, an input terminal of the pull-up transistor is electrically connected to the first clock signal line, while in each of the shift registers located in the even-numbered rows, an input terminal of the pull-up transistor is electrically connected to the second clock signal line;

the pull-up control module includes a pull-up control transistor, and an output terminal of the pull-up control transistor is electrically connected to a control terminal of the pull-up transistor; in each of the shift registers, an input terminal of the pull-up control transistor and a control terminal of the pull-up control transistor are electrically connected to the scan output terminal of the previous-stage shift register;

the pull-down control module includes a pull-down control transistor, an output terminal of the pull-down control transistor is electrically connected to the control terminal of the pull-up transistor, and an input terminal of the pull-down control transistor is electrically connected to the power node; and in each of the shift registers, a control terminal of the pull-down transistor and a control terminal of the pull-down control transistor are electrically connected to the scan output terminal of the next-stage shift register.

In one embodiment, the gate drive circuit further includes a storage module for maintaining a voltage of the control terminal of the pull-up transistor, wherein the storage module includes:
   a first storage capacitor, wherein one end of the first storage capacitor is electrically connected to the control terminal of the pull-up transistor, and another end of the first storage capacitor is electrically connected to the input terminal of the pull-up transistor; and
   a second storage capacitor, wherein one end of the second storage capacitor is electrically connected to the control terminal of the pull-up transistor, and another end of the second storage capacitor is electrically connected to the scan output terminal.

In a third aspect, the present application further provides a gate drive circuit including multiple cascaded shift registers, wherein each of the shift registers includes:
   a scan output terminal, wherein the scan output terminal in each of the shift registers is electrically connected to a scan signal line;
   a pull-down transistor, wherein an output terminal of the pull-down transistor is electrically connected to the scan output terminal, and a control terminal of the pull-down transistor is electrically connected to the scan output terminal of the next-stage shift register;
   a pull-up transistor, wherein an output terminal of the pull-up transistor is electrically connected to the scan output terminal;
   a pull-up control transistor, wherein an output terminal of the pull-up control transistor is electrically connected to a control terminal of the pull-up transistor, and an input terminal of the pull-up control transistor and a control terminal of the pull-up control transistor in each of the shift registers are electrically connected to the scan output terminal of the previous-stage shift register; and
   a pull-down control transistor, wherein an output terminal of the pull-down control transistor is electrically connected to the control terminal of the pull-up transistor, an input terminal of the pull-down control transistor is electrically connected to an input terminal of the pull-down transistor, and a control terminal of the pull-down control transistor is electrically connected to the scan output terminal of the next-stage shift register;
   wherein in each of the shift registers located in odd-numbered rows, the input terminal of the pull-down transistor is electrically connected to a first detection signal line, while in each of the shift registers located in even-numbered rows, the input terminal of the pull-down transistor is electrically connected to a second detection signal line;
   wherein in each of the shift registers located in the odd-numbered rows, an input terminal of the pull-up transistor is electrically connected to a first clock signal line, while in each of the shift registers located in the even-numbered rows, an input terminal of the pull-up transistor is electrically connected to a second clock signal line.

In one embodiment, the gate drive circuit further includes a first storage capacitor and a second storage capacitor, wherein one end of the first storage capacitor is electrically connected to the control terminal of the pull-up transistor, while another end of the first storage capacitor is electrically connected to the input terminal of the pull-up transistor; and one end of the second storage capacitor is electrically connected to the control terminal of the pull-up transistor, while another end of the second storage capacitor is electrically connected to the scan output terminal.

In a third aspect, the present application further provides a display panel, including the gate drive circuit of any of the above embodiments.

The advantageous effects of the present application are as follows: In the configuration of the first detection signal line and the second detection signal line, the pull-down modules in the shift registers of odd-numbered rows and even-numbered rows are respectively connected to the first detection signal line and the second detection signal line. This allows for the detection of short circuits between the adjacent scan lines by measuring the resistance between the first detection signal line and the second detection signal line.

BRIEF DESCRIPTION OF DRAWINGS

In order to provide a clearer explanation of the technical solutions in the embodiments of the present application, a brief introduction of the drawings required in the embodiment descriptions is presented below. It is evident that the drawings described below are only some embodiments of the present application, and those skilled in the art can obtain additional drawings based on these drawings without creative effort.

DETAILED DESCRIPTION OF EMBODIMENTS

Below, with reference to the drawings in the embodiments of the present application, a clear and comprehensive description of the technical solutions in the embodiments of this application is provided. It is evident that the described embodiments are only some of the embodiments of this application, not the entirety. Based on the embodiments in this application, all other embodiments obtained by those skilled in the art without creative effort fall within the scope of protection of this application.

Embodiments of the present application provide a gate drive circuit to address the technical issue of the difficulty in detecting short circuits between adjacent scan lines.

Figure 1:
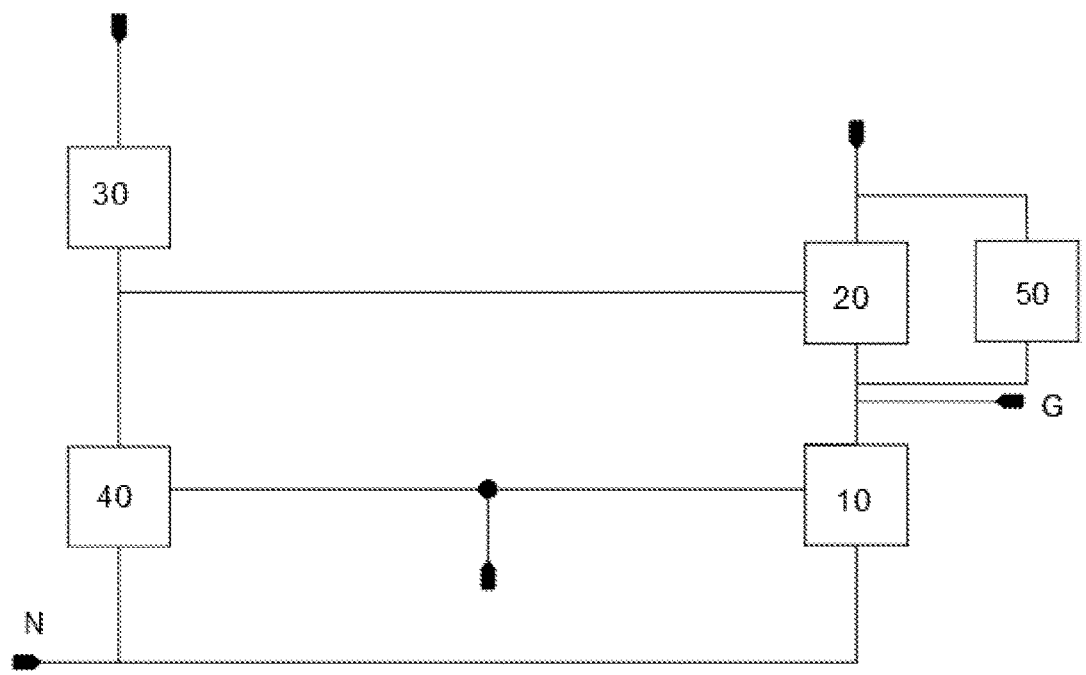
FIG. 1 is a schematic module structure diagram of a shift register of a gate drive circuit according to one embodiment of the present application.

As shown in FIG. 1, a gate drive circuit is configured for supplying scanning signals to a display panel. The gate drive circuit includes a first detection signal line VSS, a second detection signal line VSS', and multiple cascaded shift registers. Each shift register is electrically connected to a scan signal line to output the scanning signal to the scan signal line. The first detection signal line VSS and the second detection signal line VSS' have a first voltage and a second voltage. The second voltage is greater than the first voltage.

The shift register includes a scan output terminal G and a pull-down module 10. The scan output terminal G is electrically connected to the scan signal line, and the pull-down module 10 is electrically connected to both the scan output terminal G and a power node N. When the pull-down module 10 is turned on, it transfers a voltage of the power node N to the scan output terminal G.

The shift registers are arranged in multiple rows. In the shift registers located in odd-numbered rows, the power nodes N are electrically connected to the first detection signal line VSS, while in the shift registers located in even-numbered rows, the power nodes N are electrically connected to the second detection signal line VSS'.

An output terminal of each pull-down module 10 is electrically connected to the scan output terminal G. A control terminal of each pull-down module 10 is electrically connected to the scan output terminal G of the next-stage shift register. An input terminal of each pull-down module 10 is electrically connected to the power node N.

When the gate drive circuit is in a driving state, the first detection signal line VSS and the second detection signal line VSS' have the first voltage. After the pull-down module 10 is turned on, the pull-down module 10 transmits the first voltage to the scan signal line of the corresponding row. It can be understood that when the gate drive circuit is in the driving state, to turn off the multiple shift registers in a stage-by-stage manner, in consecutive two stages of the shift registers, the first voltage output by the pull-down module 10 of the next-stage shift register causes the pull-down module 10 of the previous-stage shift register to close. In other words, the first voltage is a voltage that causes the pull-down module 10 to close.

When the gate drive circuit is in a detection state, the first detection signal line VSS and the second detection signal line VSS' carry the second voltage that causes the pull-down module 10 to turn on. In this state, the pull-down module 10 is in a conducting state and transmits the second voltage to the scan signal line corresponding to the row. It can be understood that, because the input terminal of the pull-down module 10 is electrically connected to the corresponding detection signal line, and the output terminal of the pull-down module 10 is electrically connected to the corresponding scan signal line through the scan output terminal G. Therefore, when the adjacent scan lines experience a short circuit, the first detection signal line VSS and the second detection signal line VSS' are electrically connected, and a resistance between the first detection signal line VSS and the second detection signal line VSS' significantly decreases compared to the driving state. As a result, the resistance between the first detection signal line VSS and the second detection signal line VSS' can be detected to determine whether there is a short circuit in the scan lines.

In the present embodiment, in the arrangement of the first detection signal line VSS and the second detection signal line VSS', the pull-down modules 10 in the shift registers of the odd-numbered rows and the even-numbered rows are respectively connected to the first detection signal line VSS and the second detection signal line VSS'. This arrangement allows for detecting whether the adjacent scan lines are short-circuited by measuring the resistance between the first detection signal line VSS and the second detection signal line VSS'.

Figure 2:
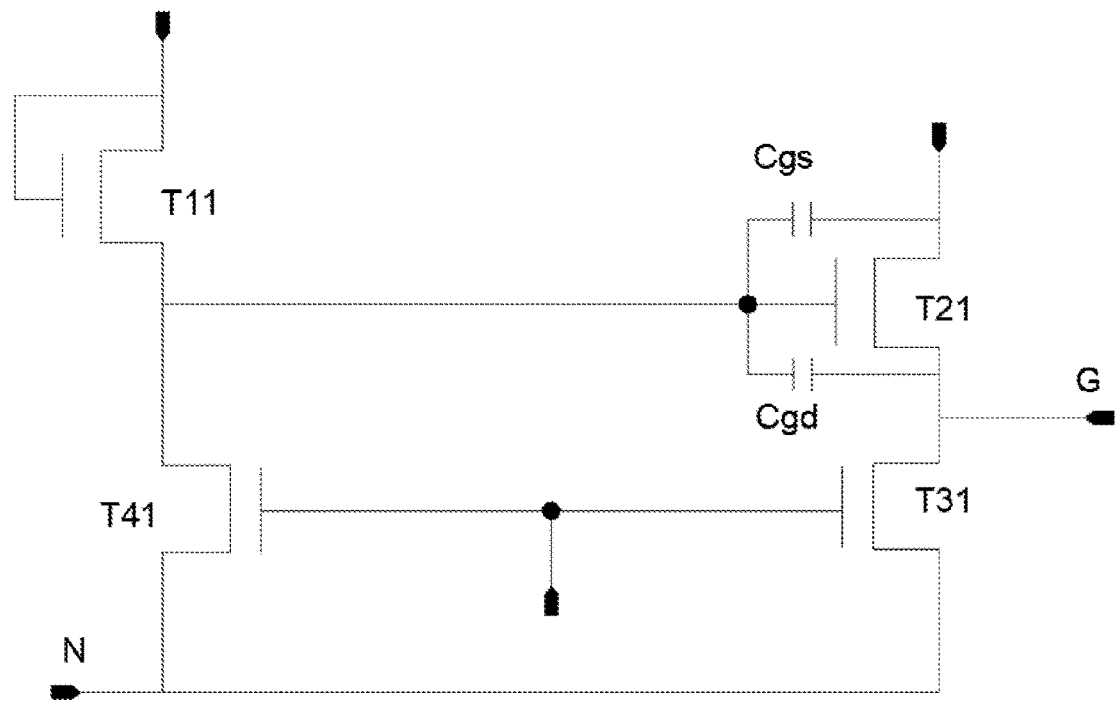
FIG. 2 is a schematic circuit structure diagram of the shift register of the gate drive circuit according to one embodiment of the present application.
Figure 3:
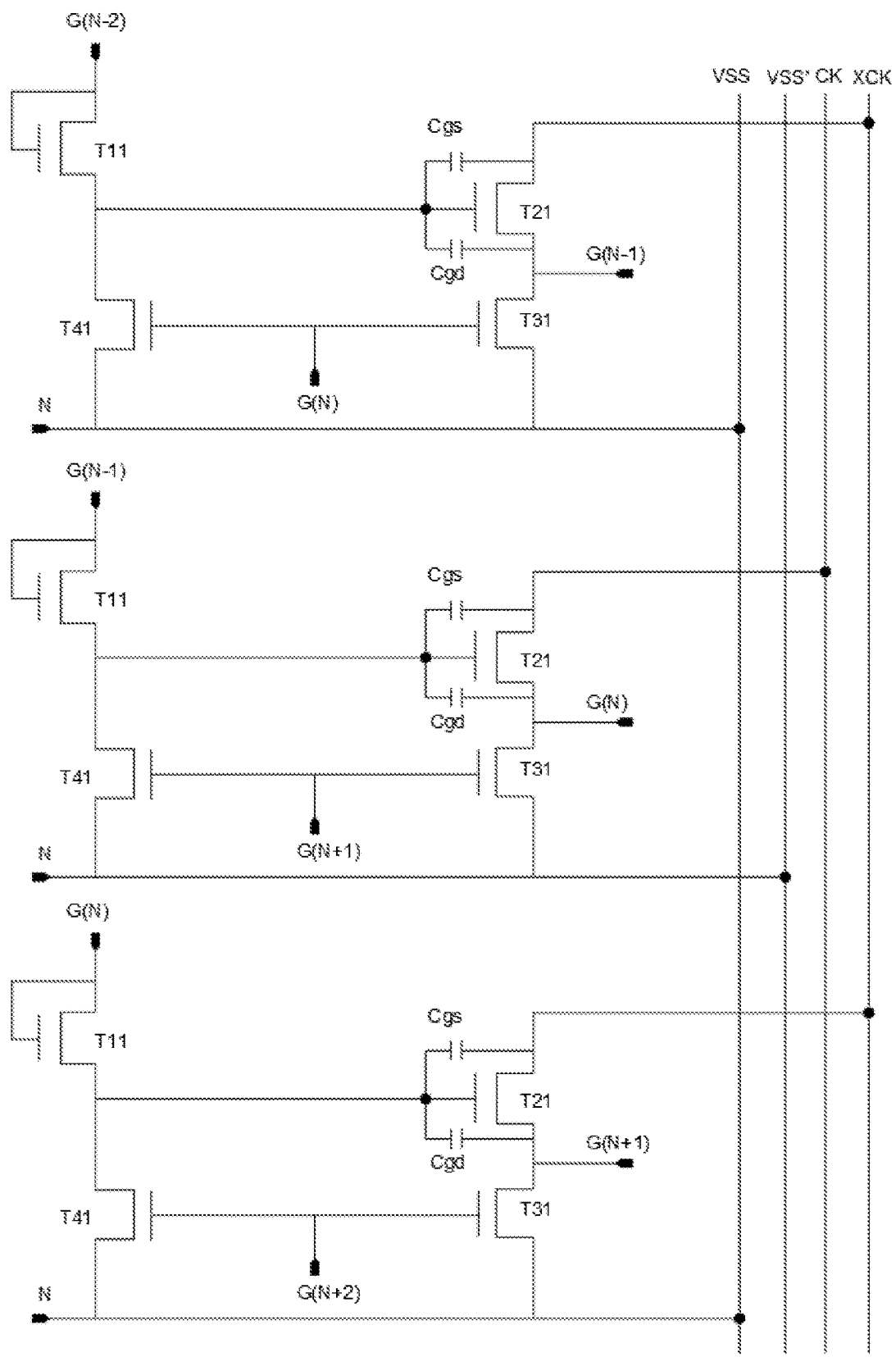
FIG. 3 is a schematic circuit structure diagram of the gate drive circuit according to one embodiment of the present application.

As shown in FIGS. 2 and 3, in one embodiment, the gate drive circuit also includes a first clock signal line XCK and a second clock signal line CK. Each of the shift registers further includes a pull-up module 20. An output terminal of the pull-up module 20 is electrically connected to the scan output terminal G.

In the multiple shift registers, an input terminal of the pull-up module 20 in the shift register located in the odd-numbered rows is electrically connected to the first clock signal line XCK, while an input terminal of the pull-up module 20 in the shift register located in the even-numbered rows is electrically connected to the second clock signal line CK.

When the gate drive circuit is in the driving state, the first clock signal line XCK and the second clock signal line CK provide scanning voltages for display on the display panel. When the gate drive circuit is in the detection state, the first clock signal line XCK and the second clock signal line CK are used to provide a third voltage, the pull-up module 20 is turned on, the third voltage is transmitted to the corresponding scan signal lines. To ensure that during detection, both the pull-down modules 10 and the pull-up modules 20 in all shift registers are turned on, the third voltage is a voltage that turns on the pull-up modules 20 and the pull-down modules 10. In some embodiments, the second voltage is equal to the third voltage, and both the second voltage and the third voltage are greater than the first voltage.

In some embodiments, the shift register further includes a pull-up control module 30. An output terminal of the pull-up control module 30 is electrically connected to a control terminal of the pull-up module 20. An input terminal and a control terminal of the pull-up control module 30 in each of the shift registers are electrically connected to the scan output terminal G of the previous-stage shift register. This configuration allows the opening of the shift register under the signal output from the scan output terminal G of the previous-stage shift register, so that the multiple shift registers are activated in a cascaded manner.

In some embodiments, the shift register also includes a pull-down control module 40. An output terminal of the pull-down control module 40 is electrically connected to the control terminal of the pull-up module 20. An input terminal of the pull-down control module 40 is electrically connected to the power node N. A control terminal of each of the pull-down control modules 40 is electrically connected to the scan output terminal G of the next-stage shift register. This configuration allows the pull-down control module to be tuned on under the signal from the scan output terminal G of the next-stage shift register and transmit the signal from the power node N to the scan output terminal G of the current-stage shift register.

A specific circuit of the gate drive circuit described in the above embodiment is illustrated now. In the present embodiment, the gate drive circuit includes multiple cascaded shift registers. Each of the shift registers includes a pull-down module 10, a pull-up module 20, a pull-up control module 30, a pull-down control module 40, a first detection signal line VSS, a second detection signal line VSS', a first clock signal line XCK, and a second clock signal line CK.

During normal operation of the gate drive circuit when driving the display panel, the first detection signal line VSS and the second detection signal line VSS' carry the first voltage. During detection, the first detection signal line VSS and the second detection signal line VSS' carry the second voltage. The second voltage is greater than the first voltage.

When the gate drive circuit is in the driving state, the first clock signal line XCK and the second clock signal line CK provide scanning voltages for displaying on the display panel. When the gate drive circuit is in the detection state, the first clock signal line XCK and the second clock signal line CK are used to supply the third voltage. The third voltage is a voltage that turn on the pull-up module 20 and the pull-down module 10.

The pull-down module 10 includes a pull-down transistor T31, the pull-up module 20 includes a pull-up transistor T21, the pull-up control module 30 includes a pull-up control transistor T11, and the pull-down control module 40 includes a pull-down control transistor T41.

The multiple cascaded shift registers are arranged in rows. The shift register in each row is electrically connected to a scan signal line through a scan output terminal G. An output terminal of the pull-down transistor T31 is electrically connected to the scan output terminal G. Among the multiple shift registers, in each shift register located in the odd-numbered rows, an input terminal of the pull-down transistor T31 is electrically connected to the first detection signal line VSS, while in each shift register located in the even-numbered rows, an input terminal of the pull-down transistor T31 is electrically connected to the second detection signal line VSS'.

An output terminal of the pull-up transistor T21 is electrically connected to the scan output terminal G. Among the multiple shift registers, in each shift register located in the odd-numbered rows, an input terminal of the pull-up transistor T21 is electrically connected to the first clock signal line XCK, while in each shift register located in the even-numbered rows, an input terminal of the pull-up transistor T21 is electrically connected to the second clock signal line CK.

An output terminal of the pull-up control transistor T11 is electrically connected to a control terminal of the pull-up transistor T21. An input terminal of the pull-up control transistor T11 and a control terminal of the pull-up control transistor T11 in each shift register are electrically connected to the scan output terminal G of the previous-stage shift register.

An output terminal of the pull-down control transistor T41 is electrically connected to the control terminal of the pull-up transistor T21. An input terminal of the pull-down control transistor T41 is electrically connected to the power node N. In each shift register, a control terminal of the pull-down transistor T31 and a control terminal of the pull-down control transistor T41 are electrically connected to the scan output terminal G of the next-stage shift register.

During the detection process, the first detection signal line VSS and the second detection signal line VSS' carry the second voltage, while the first clock signal line XCK and the second clock signal line CK carry the third voltage. The second voltage and the third voltage are voltages that open the pull-up transistor T21, the pull-up control transistor T11, the pull-down transistor T31, and the pull-down control transistor T41. Since the input terminal of the pull-down transistor T31 is electrically connected to the corresponding detection signal line, and the output terminal of the pull-down transistor T31 is electrically connected to the corresponding scan signal line through the scan output terminal G, the first detection signal line VSS and the second detection signal line VSS' become electrically connected when the adjacent scan lines short-circuit, resulting in a significant decrease in resistance between the first detection signal line VSS and the second detection signal line VSS'. Therefore, the presence of a short circuit in the scan lines can be determined by monitoring the resistance between the first detection signal line VSS and the second detection signal line VSS'.

In some embodiments, the pull-down transistor T31, the pull-up transistor T21, the pull-up control transistor T11, and the pull-down control transistor T41 are all N-type transistors, and the second voltage and the third voltage are set to a high level.

In some embodiments, the gate drive circuit further includes a storage module 50. The storage module 50 is used to maintain a voltage of the control terminal of the pull-up transistor T21. The storage module 50 includes a first storage capacitor Cgs and a second storage capacitor Cgd. One end of the first storage capacitor Cgs is electrically connected to the control terminal of the pull-up transistor T21, and the other end of the first storage capacitor Cgs is electrically connected to the input terminal of the pull-up transistor T21. One end of the second storage capacitor Cgd is electrically connected to the control terminal of the pull-up transistor T21, and the other end of the second storage capacitor Cgd is electrically connected to the scan output terminal G. It can be understood that when the control terminal of the pull-up transistor T21 receives a voltage signal, the first storage capacitor Cgs and the second storage capacitor Cgd charge to store the voltage of the control terminal of the pull-up transistor T21.

The embodiments of the present application further provide a display device. The display device includes a display panel and the gate drive circuit as described in any one of the above embodiments. The gate drive circuit is used to provide drive signals for the display panel.

In summary, although the present application has been disclosed in the preferred embodiments as described above, these preferred embodiments are not intended to limit the scope of the present application. Those skilled in the art, without departing from the spirit and scope of the application, can make various modifications and improvements. Therefore, the scope of protection of the present application is determined by the claims.

What is claimed is:

1. A gate drive circuit, comprising:
multiple cascaded shift registers, wherein each of the shift registers comprises a scan output terminal and a pull-down module; in each of the shift registers, the scan output terminal is electrically connected to a scan signal line, and the pull-down module is configured to transmit a voltage of a power node to the scan output terminal when the pull-down module is turned on;
wherein in each of the shift registers located in odd-numbered rows, the power node is electrically connected to a first detection signal line, while in each of the shift registers located in even-numbered rows, the power node is electrically connected to a second detection signal line;
when the gate drive circuit is in a driving state, the first detection signal line and the second detection signal line are configured to transmit a first voltage to the corresponding scan signal lines when the respective pull-down modules are turned on; when the gate drive circuit is in a detection state, the pull-down modules are turned on, and the first detection signal line and the second detection signal line transmit a second voltage to the corresponding scan signal lines; the second voltage is greater than the first voltage; and if it is detected that a resistance between the first detection signal line and the second detection signal line is lower than in the driving state, it is determined that a short circuit occurs in the gate drive circuit.

2. The gate drive circuit according to claim 1, wherein an output terminal of each of the pull-down modules is electrically connected to the scan output terminal, a control terminal of each of the pull-down modules is electrically connected to the scan output terminal in the next-stage shift register, and an input terminal of each of the pull-down modules is electrically connected to the power node.

3. The gate drive circuit according to claim 2, further comprising a first clock signal line and a second clock signal line, wherein each of the shift registers further comprises:

a pull-up module, wherein an output terminal of the pull up module is electrically connected to the scan output terminal;

wherein in each of the shift registers located in the odd-numbered rows, an input terminal of the pull-up module is electrically connected to the first clock signal line, while in each of the shift registers located in the even-numbered rows, an input terminal of the pull-up module is electrically connected to the second clock signal line;

wherein when the gate drive circuit is in the detection state, the first clock signal line and the second clock signal line are used to transmit a third voltage to the corresponding scan signal lines when the pull-up modules are turned on; wherein the third voltage is greater than the first voltage.

4. The gate drive circuit according to claim 3, wherein each of the shift registers further comprises:

a pull-up control module, wherein an output terminal of the pull-up control module is electrically connected to a control terminal of the pull-up module;

wherein an input terminal of the pull-up control module and a control terminal of the pull-up control module in each of the shift registers are electrically connected to a scan output terminal of the previous-stage shift register.

5. The gate drive circuit according to claim 4, wherein each of the shift registers further comprises:

a pull-down control module, wherein an output terminal of the pull-down control module is electrically connected to the control terminal of the pull-up module, and an input terminal of the pull-down control module is electrically connected to the power node, wherein a control terminal of each of the pull-down control modules is electrically connected to the scan output terminal of the next-stage shift register.

6. The gate drive circuit according to claim 5, wherein the pull-down module comprises a pull-down transistor, and an output terminal of the pull-down transistor is electrically connected to the scan output terminal; among the shift registers, in each of the shift registers located in the odd-numbered rows, an input terminal of the pull-down transistor is electrically connected to the first detection signal line, while in each of the shift registers located in the even-numbered rows, an input terminal of the pull-down transistor is electrically connected to the second detection signal line;

the pull-up module comprises a pull-up transistor, and an output terminal of the pull-up transistor is electrically connected to the scan output terminal; among the shift registers, in each of the shift registers located in the odd-numbered rows, an input terminal of the pull-up transistor is electrically connected to the first clock signal line, while in each of the shift registers located in the even-numbered rows, an input terminal of the pull-up transistor is electrically connected to the second clock signal line;

the pull-up control module comprises a pull-up control transistor, and an output terminal of the pull-up control transistor is electrically connected to a control terminal of the pull-up transistor; in each of the shift registers, an input terminal of the pull-up control transistor and a control terminal of the pull-up control transistor are electrically connected to the scan output terminal of the previous-stage shift register;

the pull-down control module comprises a pull-down control transistor, an output terminal of the pull-down control transistor is electrically connected to the control terminal of the pull-up transistor, and an input terminal of the pull-down control transistor is electrically connected to the power node; and in each of the shift registers, a control terminal of the pull-down transistor and a control terminal of the pull-down control transistor are electrically connected to the scan output terminal of the next-stage shift register.

7. The gate drive circuit according to claim 6, wherein the gate drive circuit further comprises a storage module for maintaining a voltage of the control terminal of the pull-up transistor, wherein the storage module comprises:

a first storage capacitor, wherein one end of the first storage capacitor is electrically connected to the control terminal of the pull-up transistor, and another end of the first storage capacitor is electrically connected to the input terminal of the pull-up transistor; and a second storage capacitor, wherein one end of the second storage capacitor is electrically connected to the control terminal of the pull-up transistor, and another end of the second storage capacitor is electrically connected to the scan output terminal.

8. A display panel, comprising a gate drive circuit, wherein the gate drive circuit comprises multiple cascaded shift registers, and each of the shift registers comprises a scan output terminal and a pull-down module, wherein in each of the shift registers, the scan output terminal is electrically connected to a scan signal line, and the pull-down module is configured to transmit a voltage of a power node to the scan output terminal when the pull-down module is turned on;

wherein in each of the shift registers located in odd-numbered rows, the power node is electrically connected to a first detection signal line, while in each of the shift registers located in even-numbered rows, the power node is electrically connected to a second detection signal line;

when the gate drive circuit is in a driving state, the first detection signal line and the second detection signal line are configured to transmit a first voltage to the corresponding scan signal lines when the respective pull-down modules are turned on; when the gate drive circuit is in a detection state, the pull-down modules are turned on, and the first detection signal line and the second detection signal line transmit a second voltage to the corresponding scan signal lines; the second voltage is greater than the first voltage; and if it is detected that a resistance between the first detection signal line and the second detection signal line is lower than in the driving state, it is determined that a short circuit occurs in the gate drive circuit.

9. The display panel according to claim 8, wherein an output terminal of each of the pull-down modules is electrically connected to the scan output terminal, a control terminal of each of the pull-down modules is electrically connected to the scan output terminal in the next-stage shift register, and an input terminal of each of the pull-down modules is electrically connected to the power node.

10. The display panel according to claim 9, further comprising a first clock signal line and a second clock signal line, wherein each of the shift registers further comprises:

a pull-up module, wherein an output terminal of the pull up module is electrically connected to the scan output terminal;

wherein in each of the shift registers located in the odd-numbered rows, an input terminal of the pull-up module is electrically connected to the first clock signal line, while in each of the shift registers located in the even-numbered rows, an input terminal of the pull-up module is electrically connected to the second clock signal line;

wherein when the gate drive circuit is in the detection state, the first clock signal line and the second clock signal line are used to transmit a third voltage to the corresponding scan signal lines when the pull-up modules are turned on; wherein the third voltage is greater than the first voltage.

11. The display device according to claim 10, wherein each of the shift registers further comprises:

a pull-up control module, wherein an output terminal of the pull-up control module is electrically connected to a control terminal of the pull-up module;

wherein an input terminal of the pull-up control module and a control terminal of the pull-up control module in each of the shift registers are electrically connected to a scan output terminal of the previous-stage shift register.

12. The display device according to claim 11, wherein each of the shift registers further comprises:

a pull-down control module, wherein an output terminal of the pull-down control module is electrically connected to the control terminal of the pull-up module, and an input terminal of the pull-down control module is electrically connected to the power node, wherein a control terminal of each of the pull-down control modules is electrically connected to the scan output terminal of the next-stage shift register.

13. The display device according to claim 12, wherein the pull-down module comprises a pull-down transistor, and an output terminal of the pull-down transistor is electrically connected to the scan output terminal; among the shift registers, in each of the shift registers located in the odd-numbered rows, an input terminal of the pull-down transistor is electrically connected to the first detection signal line, while in each of the shift registers located in the even-numbered rows, an input terminal of the pull-down transistor is electrically connected to the second detection signal line;

the pull-up module comprises a pull-up transistor, and an output terminal of the pull-up transistor is electrically connected to the scan output terminal; among the shift registers, in each of the shift registers located in the odd-numbered rows, an input terminal of the pull-up transistor is electrically connected to the first clock signal line, while in each of the shift registers located in the even-numbered rows, an input terminal of the pull-up transistor is electrically connected to the second clock signal line;

the pull-up control module comprises a pull-up control transistor, and an output terminal of the pull-up control transistor is electrically connected to a control terminal of the pull-up transistor; in each of the shift registers, an input terminal of the pull-up control transistor and a control terminal of the pull-up control transistor are electrically connected to the scan output terminal of the previous-stage shift register;

the pull-down control module comprises a pull-down control transistor, an output terminal of the pull-down control transistor is electrically connected to the control terminal of the pull-up transistor, and an input terminal of the pull-down control transistor is electrically connected to the power node; and in each of the shift registers, a control terminal of the pull-down transistor and a control terminal of the pull-down control transistor are electrically connected to the scan output terminal of the next-stage shift register.

14. The display device according to claim 13, wherein the gate drive circuit further comprises a storage module for maintaining a voltage of the control terminal of the pull-up transistor, wherein the storage module comprises:

a first storage capacitor, wherein one end of the first storage capacitor is electrically connected to the control terminal of the pull-up transistor, and another end of the first storage capacitor is electrically connected to the input terminal of the pull-up transistor; and a second storage capacitor, wherein one end of the second storage capacitor is electrically connected to the control terminal of the pull-up transistor, and another end of the second storage capacitor is electrically connected to the scan output terminal.

* * * * *